United States Patent [19]

Miller

[11] Patent Number: 5,498,863
[45] Date of Patent: Mar. 12, 1996

[54] WAVELENGTH-SENSITIVE DETECTORS BASED ON ABSORBERS IN STANDING WAVES

[75] Inventor: David A. B. Miller, Fair Haven, N.J.

[73] Assignee: AT&T Corp., Murray Hill, N.J.

[21] Appl. No.: 55,487

[22] Filed: Apr. 30, 1993

[51] Int. Cl.$^6$ .......................... H01L 31/04; H01L 29/205
[52] U.S. Cl. .......................... 250/214.1; 257/21; 257/436; 324/645
[58] Field of Search .......................... 250/214.1, 214 LS; 257/17, 21, 22, 186, 436; 324/645, 95, 637, 638, 646

[56] References Cited

U.S. PATENT DOCUMENTS

| | | | |
|---|---|---|---|
| 3,796,948 | 3/1974 | Wentworth | 250/214.1 |
| 4,749,850 | 6/1988 | Chemla et al. | 250/211 |
| 5,079,507 | 1/1992 | Ishida et al. | 324/645 |
| 5,229,627 | 7/1993 | Kosaka | 257/436 |
| 5,389,797 | 2/1995 | Bryan et al. | 257/21 |

Primary Examiner—Edward P. Westin
Assistant Examiner—John R. Lee
Attorney, Agent, or Firm—Eugene S. Indyk

[57] ABSTRACT

An optoelectronic detector includes multilayered semiconductor structures that are placed at particular positions in a standing wave pattern in order to measure the intensity of the light beams passing through said structures' layers. The detector is made sensitive to particular wavelengths by either changing the light beams intensity or varying the absorbance of the layers.

6 Claims, 6 Drawing Sheets

WAVELENGTH-SENSITIVE DETECTORS BASED ON ABSORBERS IN STANDING WAVES

TECHNICAL FIELD

This invention relates to detectors. More specifically, this invention relates to wavelength-sensitive optical and optoelectronic detectors.

1. Background

Optical sensors and detectors are increasingly replacing other technologies-based detectors in specific applications, such as environmental applications, primarily because of their ability to operate in harsh or contaminated surroundings. Market penetration of optical detectors in other applications, however, has been inhibited by a series of factors. Prominent among those factors is the fact that existing optical detectors use many different elements which cannot be integrated onto one chip, therefore resulting in bulky, high cost systems. Other factors preventing mass-production of optical detectors include a) restriction of their wavelength sensitivity to specific spectral regions b) inability to make simple and rapid changes to optical detectors in order to make them sensitive to particular wavelengths.

2. Cross-Reference to Related Application

Other aspects of a related wavelength control technique, as applied to a tunable laser, are discussed in the commonly assigned co-pending U.S. patent application, Ser. No. 08/055,492 "entitled "Tunable Lasers Based on Absorbers and Standing Waves.

SUMMARY

The present invention is directed to a detector whose sensitivity to particular wavelengths is measured by the amount of light absorbed by absorbing materials placed in a standing wave formed by the interference of light beams. In accordance with the invention, the wavelengths to which the detector is sensitive can be changed through variations in the sensitivity of those absorbing materials. Changes in the sensitivity of those materials can be achieved, for example, by either varying the strength of the absorbing materials or changing the weighting of signals applied to specific sections of the absorbing materials.

In a preferred embodiment of the invention, a set of absorbing layers, such as semiconductor photodiodes, are configured to act as light intensity detectors by being positioned within a standing wave pattern formed by interfering at least two light beams. Because the positions of the maxima and minima in the standing wave pattern depend on the wavelength of the light, the signal from the light intensity detectors also varies with the wavelength, thus making a detection system whose output depends on the wavelength of the light. Appropriate selections of the positions of the light intensity detectors allow particularly useful wavelength dependences of the detector output, including strong detection at one particular frequency.

When, in addition, the strength of the absorption in the absorbing layers is controlled by applying, for example, a voltage to dimes to change such absorption through the well-known Franz-Keldysh or quantum-confined Stark effects, the wavelength dependence of the detector system output can be controlled electrically.

In another embodiment of the invention, weighting factors are assigned to the detector output generated by the interaction of the standing wave with the individual absorber layers. The chosen weighting factor depends on the position of a particular point on the wave. For example, a positive factor can be assigned to the output of detectors whose position coincides with a maximum (called "antinode") of the standing wave for a desired wavelength. Conversely, a negative factor of equal value can be assigned to the output of detectors whose position coincides with a minimum (called "node ") in the standing wave pattern at the same desired wavelength. In this case, optical input at the desired wavelength (i.e., the one at which the nodes and antinodes line up with the absorber layers) results in no cancellation when the weighted detector outputs are added for that particular wave. For other wavelengths, the summation of the weighted factors gives a smaller net result, hence giving a smaller detected signal. The use of other weighting factors can be used to change the wavelength sensitivity of the system overall.

DETAILED DESCRIPTION

Figure 1:
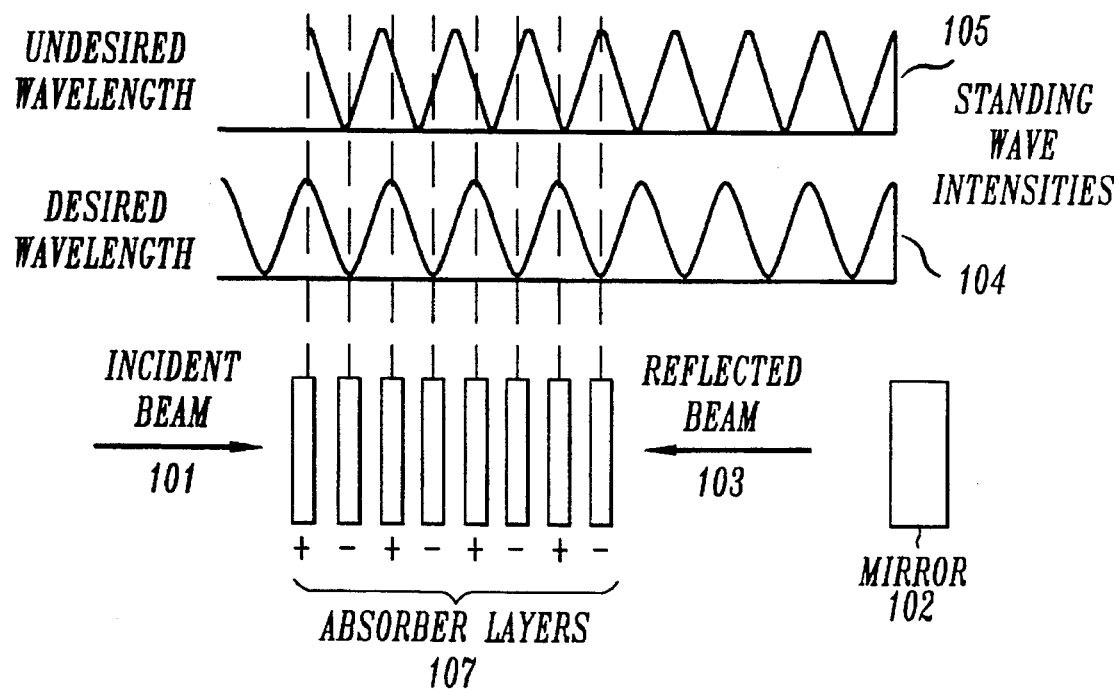
FIG. 1 is an illustrative representation of a detector with a layered structure designed, in accordance with the invention, to be sensitive to a particular wavelength.

FIG. 1 is an illustrative representation of a detector with a layered structure designed, in accordance with the invention, to be sensitive to a particular wavelength. In FIG. 1, an incident beam 101, emanating from a source (not shown) is reflected off a mirror 102 to generate a reflected beam 103. When the incident wavelength is substantially equal to the desired wavelength, the standing wave pattern formed by the interference of beams 101 and 103 will be of the form 104. By contrast, at another undesired wavelength, the standing wave pattern will be of the form 105. When the light beams traverse absorber layers 107, those layers sense the intensity of the light beams 101 and 103 to generate electrical signals that are proportional to the intensity of the light. The signals from the absorber layers 107 are multiplied by the weights shown and then summed up in some apparatus that may be, by way of example, a simple electrical resistive circuit summing with different resistor values, or a differential amplifier with inverting (−) and non-inverting (+) inputs that are applied to two such summing circuits. For the desired wavelength 104, all the nodes of the standing wave pattern line up with the layers of absorber layers 107 with +1 weighting, whereas all the antinodes line up with the detectors with −1 weighting. Thus, the net detected signal is +4 units. For the case of the undesired wavelength 105, the net result after the summation in this particular case is zero. In general, only the desired wavelength and some of its harmonics will have no cancellation in the summation. All other wavelengths will experience some cancellation. For simplicity, it is assumed that there is very little absorption in the absorber layers 107 so that the standing wave pattern is not perturbed by the absorption. The mirror 102 is also assumed to have no phase change on reflection, so that there will be an antinode in the standing wave pattern at that mirror.

Although the specific example in FIG. 1 has the layers of absorber layers 107 spaced by quarter wavelengths, it is to be understood that other spacings can also be used. For example, identical signals can be detected when the layers of absorber layers 107 are spaced three quarters (¾) of wavelengths apart. In general, any integer number of half wavelengths can be added to the spacing, and still get the same detected signal at a desired wavelength, although the wavelength sensitivity of the detector will be changed and the detector will now also detect some other wavelengths. This option to space the absorbers further apart may be useful for fabrication of some devices where it is difficult to put the layers very close together. For example, it could be difficult to contact separate detectors if they are spaced only a quarter of a wavelength apart.

The detector of FIG. 1 can be made sensitive to particular wavelengths by varying or even turning off and on the absorption in particular layers of absorber layers 107.

The use of other weighting factors in the sensing of the detector output could also be used to change the wavelength sensitivity of the system overall as discussed below.

Figure 2:
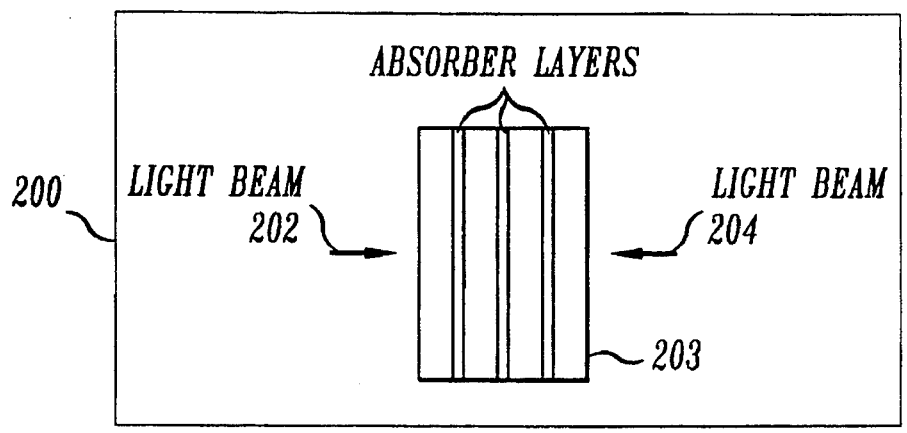
FIG. 2 shows a longitudinal grating structure with absorber layers and back reflection of propagating beams.

FIG. 2 shows a longitudinal grating structure with absorber layers and counterpropagating light beams. The longitudinal grating structure of FIG. 2 can be used as a component to implement the detector contemplated by the invention. In longitudinal grating structure 200, two counterpropagating beams are shown traveling perpendicular to a surface formed by absorber layers 203 (although the beams need not necessarily be counterpropagating, nor need they be perpendicular to the surface). The longitudinal interference of beams 202 and 204 on absorber layers 203 results in a standing wave pattern (not shown) being formed. One illustrative selection of positions of the absorber layers is to place them in such a way as to coincide with the nodes and the antinodes of the standing wave pattern, as described in FIG. 1 above.

Figure 3:
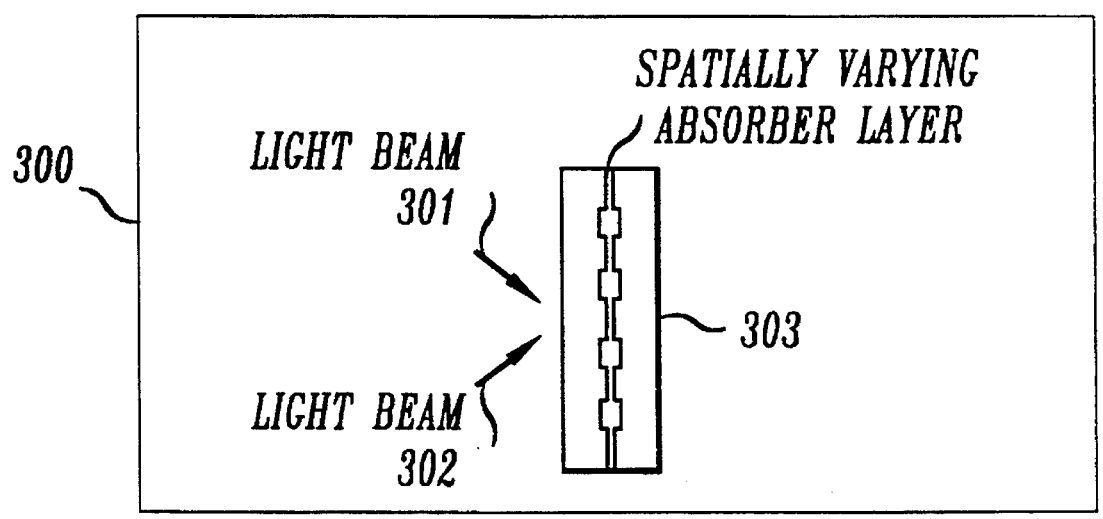
FIG. 3 shows a transverse grating structure with absorber layers and interfering beams incident at an angle on a surface.

FIG. 3 shows a transverse grating structure with absorber layers and interfering light beams incident to an angle on a surface. The transverse grating structure of FIG. 3 can be used as a component for the detector of the invention. In transverse grating structure 300, light beams 301 and 302 are shown propagating at an angle to each other and incident to a plane surface formed by spatially varying absorber layer 303 (although neither the angle or planarity of the surface are necessary restrictions). The interference of beams 301 and 302 results in a transverse interference pattern being formed in which, different points on absorber layer 303 correspond to different points on a standing wave pattern. One illustrative selection of positions of strong absorption is to place the layers in absorbing layer 303 in analogous positions to the illustrative embodiment of FIG. 1 in which, stronger absorption points are chosen to coincide with the nodes and the antinodes of the standing wave. Thus, the intensity in the standing wave pattern varies laterally within the absorbing layers 303, as discussed below.

Advantageously, the transverse grating structure 300 affords larger spacing of the nodes and antinodes, thereby allowing complex structures of absorbers to be fabricated by conventional lithography. It may also be easier with the transverse grating structure 300 to make separate connections to each of the absorbing sections described above, using, for example, standard lithographic techniques. In addition, with the transverse structure of FIG. 3, it is possible to make contacts with each detecting element in the layer, and hence to feed them separately to an electrical circuit with appropriate weights for summing. When those weights are controlled electrically, the detector is fully tunable, or more specifically, the detector is sensitive to selectable wavelengths within a wide range.

As mentioned above, other weighting factors in the sensing of the detector output can also be used to change the sensitivity of the detector of FIG. 1 to different wavelengths. For example, the weights can be changed either in the fabrication process, or by controlling the amount of absorption by some other means, such as electric field. To change the weights by fabrication in the longitudinal detector of FIG. 2, the relative absorption of the layers in absorber layers 203 is changed by making specific absorbing layers thicker or thinner. If the layers are quantum wells, the absorption may not change proportionately with thickness. In that case, low integer weights can be achieved by putting more than one quantum well close together at the appropriate points so that they are all approximately sampling the same point in the standing wave. The weight would increase proportionally with the number of such wells. For the transverse detector of FIG. 3, the weights can be changed by choosing different widths for the detecting elements. In either the longitudinal or transverse cases, the weights can be changed after fabrication, if the amount of absorption can be changed through variations in the the voltage applied to the individual detecting elements. For semiconductor systems, the absorption could be changed either through the Franz-Keldysh effect for bulk semiconductor layers, or through the quantum-confined Stark effect for quantum wells, for example.

Figure 4:
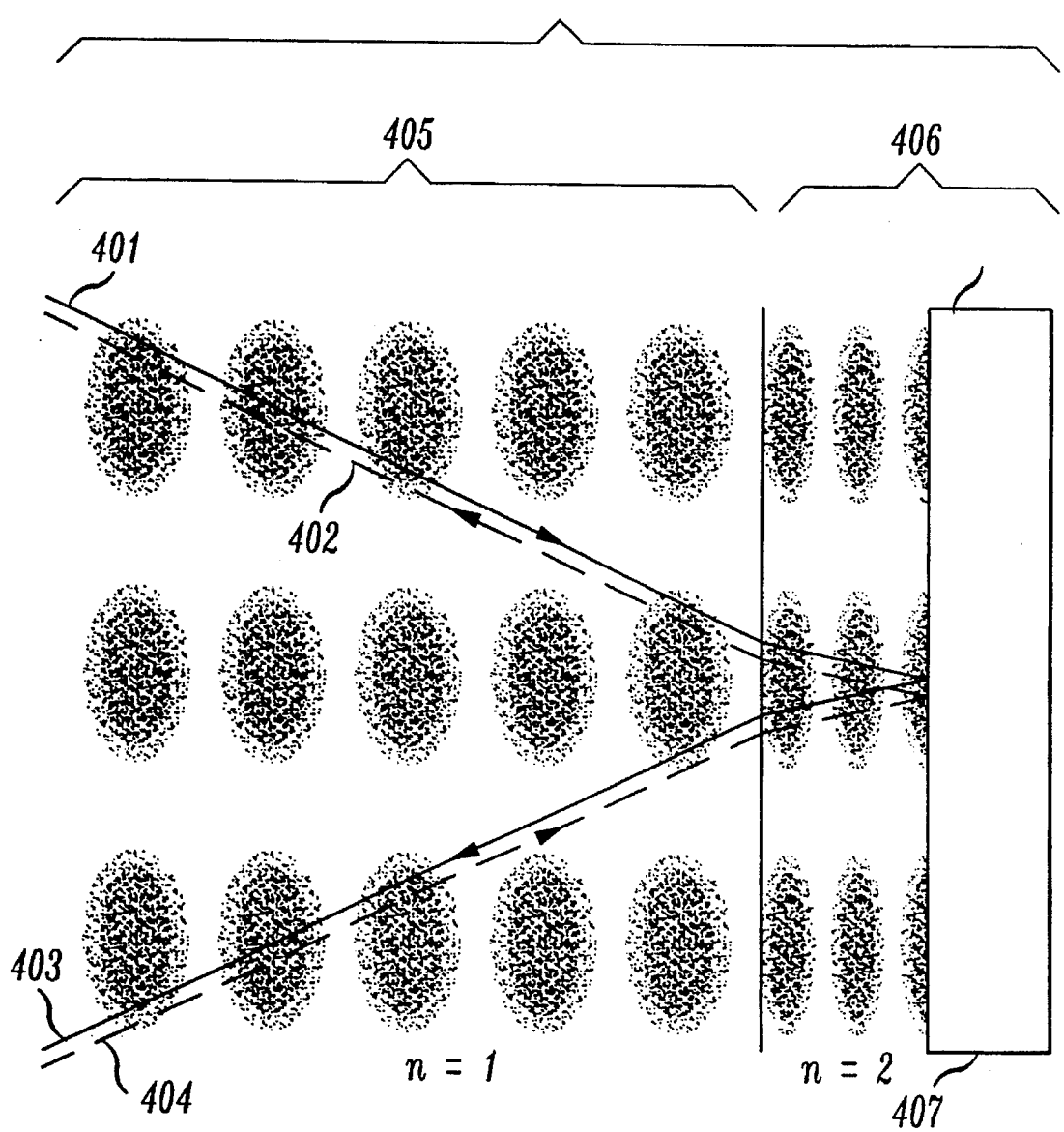
FIG. 4 illustrates the form of a standing wave pattern for a grating structure with two pairs of counterpropagating beams.

FIG. 4 illustrates the form of a standing wave pattern for a transverse grating structure with two pairs of counterpropagating beams. In FIG. 4, counterpropagating beams 401, 402, 403 and 404 reflect off mirror 407 passing through materials 405 and 406 of refractive indexes 1 and 2, respectively. The darker regions of FIG. 4 correspond to higher intensity points in the standing wave pattern. FIG. 4 also shows the changes in the wave pattern as the beams traverse through materials 405 and 406. Although the angles of the beams are changed in passing through the two materials, the spacing of the transverse interference pattern is not affected. By contrast, the longitudinal pattern does change, as indicated by the shorter horizontal distances between the darker regions of FIG. 4. This sensitivity to the position of the longitudinal maxima in the interference pattern in the four-beam case indicates that the phase change on reflection from mirror 407 is of particular importance, since that phase change affects the optimum positioning of thin absorber layers relative to the mirror 407.

Figure 5:
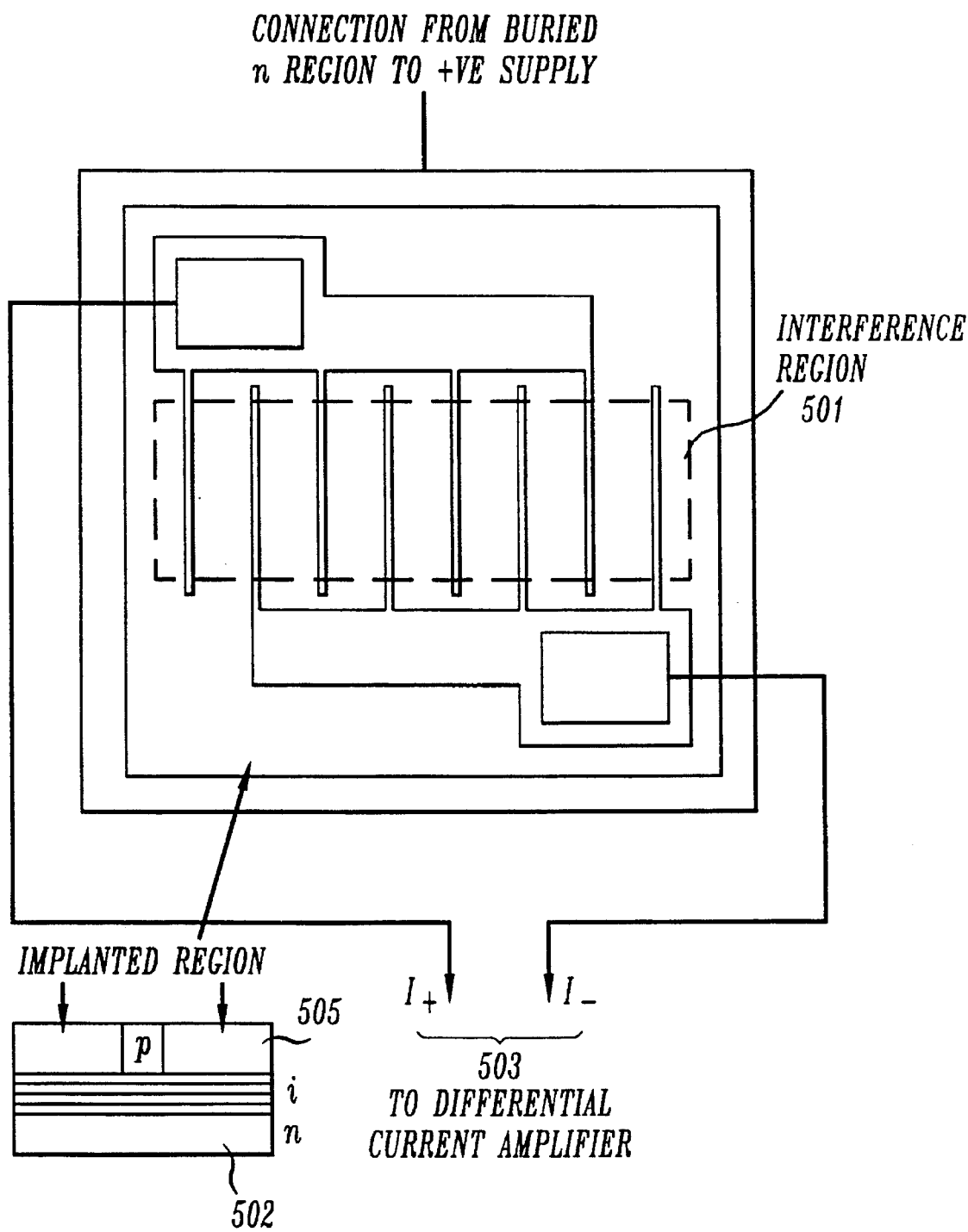
FIG. 5 is a schematic diagram of a transverse grating narrow-band detector.

FIG. 5 is a schematic diagram of a transverse grating narrow-band detector. In the detector of FIG. 5, rather than patterning the absorber directly, the conductivity of a p-layer in a p-i-n diode is patterned. In FIG. 5, +1 and −1 weights are applied to the detector by means of a differential current amplifier 503. The detector of FIG. 5 has an interference region 501 comprised of 8 detector elements. Implanted outside the interference region 501, is a group of top p-layers such as the p-layer 505 in p-i-n diode 502. In use, the diodes will be reverse biased. Every place in which the p-layer has not been implanted, a field is applied across the diodes in order to sweep out any photocurrent. It may also be desirable to extend the implantation to the interference region 401 to suppress any undesired photocurrent that might otherwise be collected from the other regions.

The detector of FIG. 5 has the advantage of being fully self-aligned; there is no need to align the patterning of the absorber and the conducting contact layers over the absorbers. Where there is no implant, a conducting p-layer is left, needing no other deposited conducting material. Such a self-aligned process allows particularly narrow conducting p-regions to be made. With this structure, there are no mesa etches or metallic contacts within the interference region, so the grating structure is not apparent to the light beam to give diffraction in any other way. This device could conveniently be used in the mode where reverse bias on the diode turns on the absorption, as could be achieved with quantum wells. When used in this way, there is no absorption in the regions underneath the implanted regions, without having to pattern the absorber material itself. Note in this case that different weights (of a given sign) could be set by fabricating different widths of detector.

Figure 6:
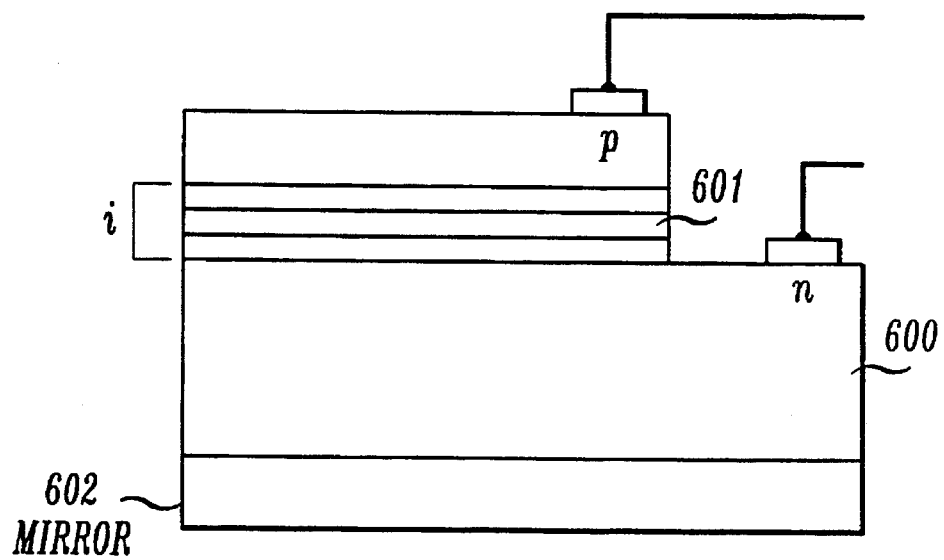
FIG. 6 shows a single absorber wavelength-sensitive detector.

FIG. 6 shows a single absorber wavelength-sensitive detector. In FIG. 6, the absorber 601 is contained within a p-i-n diode 600. The absorber 601 is at a fixed distance from mirror 602. For a reverse biased diode, the detected signal could then be the current from the diode. The detector of FIG. 6 is one of the simplest wavelength sensitive detectors that can be made. The detector of FIG. 6 gives a) a large output when the antinode of the standing wave (not shown) coincides with the absorber 601 at a fixed distance from the mirror, and b) close to zero output when a node coincides with the absorber 601. Advantageously, the detector of FIG. 6 can be sensitive to a long wavelength and insensitive to a short wavelength, in contrast to conventional detectors that are not so flexible. Normally, when a semiconductor is used to make a detector, it is straightforward for the detector to respond to short wavelengths but not to long wavelengths; the cut-off wavelength between the two regions is simply the optical absorption edge of the semiconductor. Many applications, however, require the opposite property of responding to a longer wavelength but not to a shorter one. An example would be detectors for a two-color wavelength division multiplexed communications system. Detectors for the shorter wavelength that did not detect the longer wavelength could simply be made with an appropriate choice of semiconductor bandgap, but to detect the longer wavelength without detecting (or even absorbing) the shorter one is more difficult; The detector structure of FIG. 6 can clearly perform the required function by choosing the shorter wavelength to correspond to a minimum in the detector response.

Figure 7:
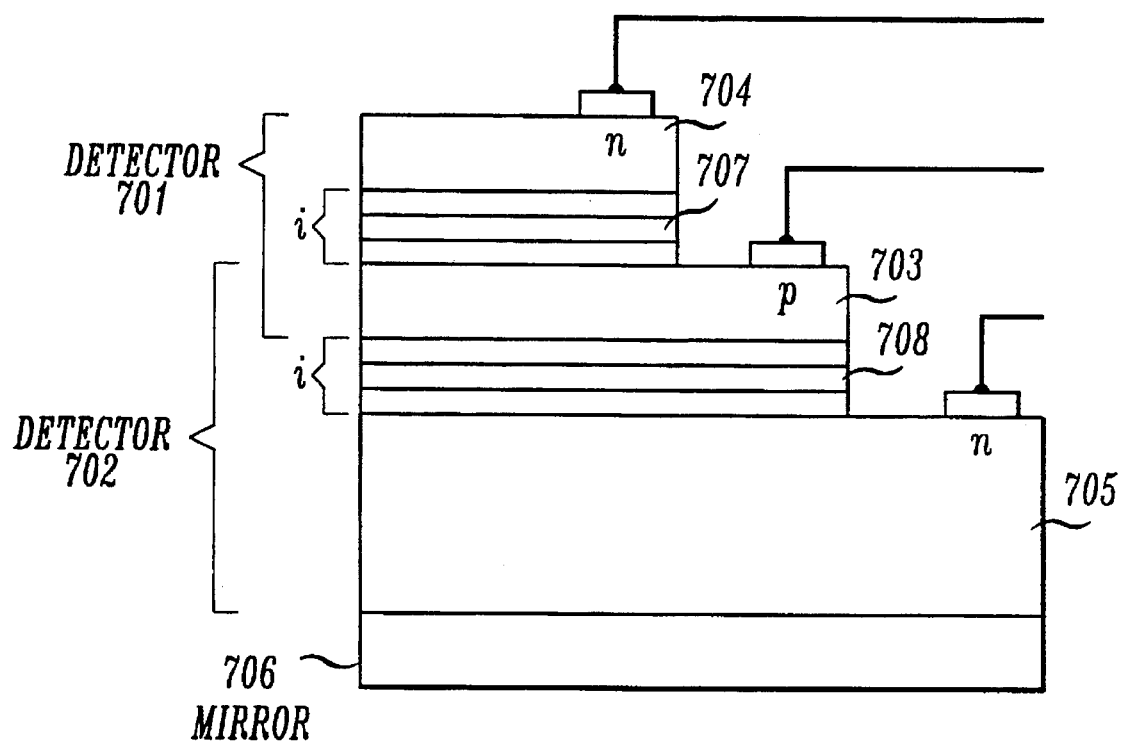
FIG. 7 shows an illustrative two-absorber wavelength sensitive detector.

FIG. 7 shows an illustrative two-absorber wavelength sensitive detector. In FIG. 7, two detectors, 701 and 702, are positioned in the standing wave pattern (not shown) at fixed distances relative to a mirror 706. The two detectors 701 and 702 are made as p-i-n photodiodes. The two diodes share a common p-layer 703 for simplicity in the structure. The necessary signals could be extracted from the currents from the two n-layer contacts 704 and 705, with the p-layer contact 703 serving as a common ground connection.

For the two-wavelength detector of FIG. 7, detector 701 is chosen to be near an antinode for the first wavelength and at a node for the second, hence detecting signals at the first and not the second wavelength. Detector 702 has the situations reversed so that it detects the second wavelength and not the first.

When the input to the detector of FIG. 7 is predominantly monochromatic, the wavelength of the incident radiation can be calculated from the relative responses of detectors 701 and 702 at different points in the standing wave pattern (not shown). There are several ways in which the signals from the two detectors 701 and 702 can be processed to deduce the wavelength. For example, if the absolute power in the incident beam is known, the wavelength can be calculated from the difference in signals. Alternatively, to avoid having to measure the power separately, the ratio of the two signals can be used. The ratio may be inconvenient since it can vary very greatly, and can even become singular when one of the signals is zero. A third possibility is to use the quotient $$q = \frac{a-b}{a+b} ,\qquad(5.2.1)$$

where a and b represent the signals from detectors 701 and 702, respectively. The latter alternative avoids a separate power measurement.

In order to get a better understanding of the detector of FIG. 7, let us assume for simplicity that mirror 706 is 100% reflecting with no phase change on reflection off the mirror. In that case, the standing wave intensity pattern for a monochromatic wave of wave vector k in the positive z direction can be represented by the equation:

$$I(z)=2I_0(1+\cos 2kz),\qquad(1)=ps$$

where z is selected to be 0 at the position of the mirror. In that case, $$q = \frac{\cos 2kd_a - \cos 2kd_b}{\cos 2kd_a + \cos 2kd_b} = \frac{\sin(k(d_a+d_b))\sin(k(d_a-d_b))}{1+\cos(k(d_a+d_b))\sin(k(d_a-d_b))}$$

This expression is not readily invertible analytically to give k (and hence the wavelength $\lambda=2\pi/k$), and does not, of course, give a unique value for the wavelength. There are many different wavelengths that can give the same ratio, depending on how many half wavelengths fit into the region between the detectors 701 and 702 and the mirror 706. Within a given range of wavelengths, however, a unique wavelength can be derived.

Figure 8:
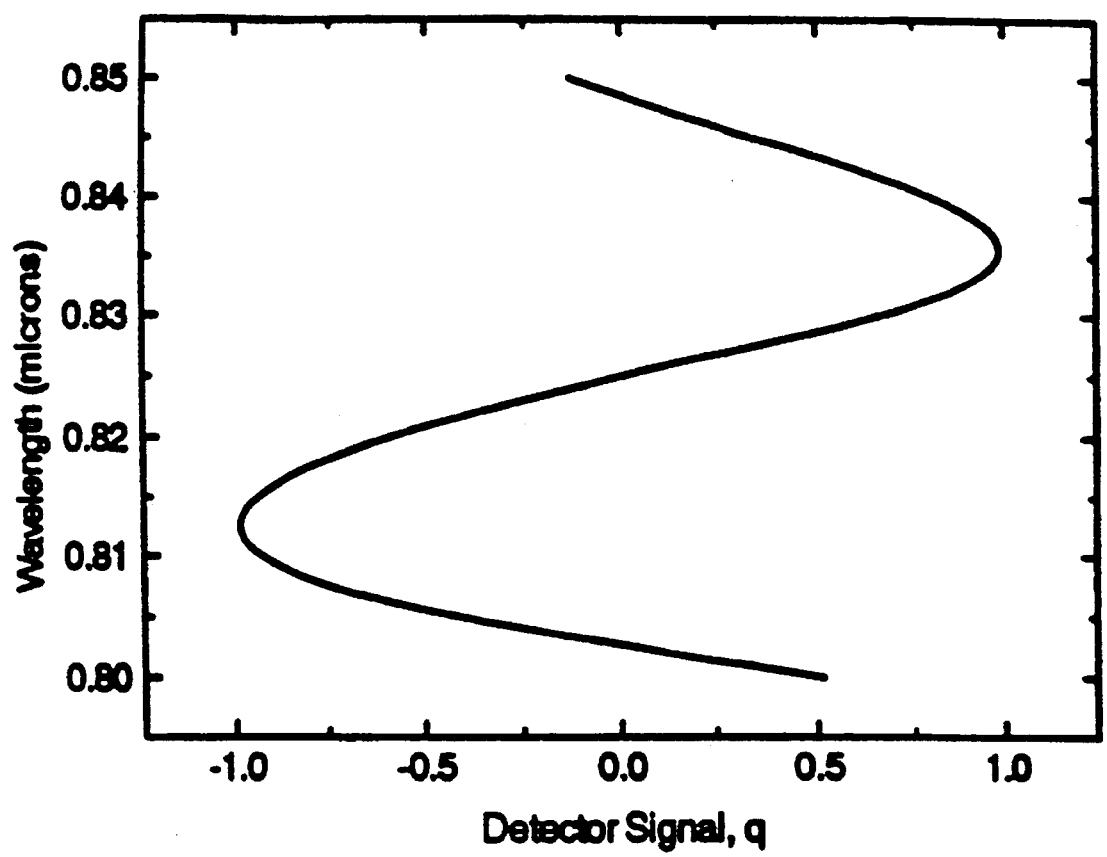
FIG. 8 shows the relation between the wavelength of a beam and the detector signal for the detector of FIG. 7 when it is used as a wavelength-measuring detector.

FIG. 8 gives an illustrative calculation showing the relation between q and $\lambda$, for the particular layer structure of FIG. 7. In the example of FIG. 8, the structure of FIG. 7 has distances $d_a=1.915$ micrometers and $d_b=2.328$ micrometers where $d_a$ and $d_b$ represent the distance measured to the center of the absorbing layers 707 and 708 for detectors 702 and 701, respectively. The calculated structure also assumes a refractive index of 3.5 throughout and absorbers that are 10 nm thick with an absorption coefficient of $10^4$ cm$^{-1}$.

At a wavelength $\lambda$, =825 nm, the separation between the centers of the absorbing layers, $d_a-d_b$, corresponds to $7\lambda/4$, and the distance from the mirror 706 to the center point between the layers, $(d_a-d_b)/2$ corresponds to $9\lambda$. As can be seen from the representative calculation in FIG. 8, for a particular range of wavelengths (e.g., 815 nm to 835 nm) there is a smooth relation between the measurement q and the incident wavelength. This relation is relatively linear between 820 nm and 830 nm for this example. Of particular importance is the fact that in the example of FIG. 8, the separation between the absorbing layers is selected to be an odd number of quarter wavelengths to avoid the situation where nodes are present at both detectors 701 and 702, and hence zero power is detected.

I claim:

1. An optical detector comprising:

a transmissive medium supporting a standing wave of electromagnetic energy:

at least one absorptive element in the medium:

means for measuring an amount of said electromagnetic energy absorbed in the at least one absorptive element; and means for applying weighting factors to various levels of intensity of said electromagnetic energy absorbed by the at least one absorptive element to set at least one wavelength at which the detector is sensitive.

2. An optical detector comprising:

a transmissive medium supporting a standing wave of electromagnetic energy:

at least one absorptive element in the medium:

means for measuring an amount of said electromagnetic energy absorbed in the at least one absorptive element; and means for varying levels at which said at least one absorptive element absorbs said electromagnetic energy to enable detection of a plurality of wavelengths for said electromagnetic energy by said detector.

3. The invention of claim 2 wherein said varying means includes:

means for changing the strength of absorption in said at least one absorptive element.

4. The invention of claim 3 wherein said means for changing the strength of absorption of said at least one absorptive element includes:

means for applying voltage to said at least one absorptive element.

5. An optoelectronic detector comprising:

means for positioning a plurality of multilayered semiconductor structures in a standing wave pattern formed by interference of light beams;

means for measuring in said multilayered semiconductor structures the intensity of the light beams passing therethrough, wherein amount of light passing through layers of said multilayered semiconductor structures reflects said detector's sensitivity to a particular wavelength of said lightbeams; and means for changing wavelengths to which said detector is sensitive by changing the amount of light from said lightbeams which is absorbed by said multilayered semiconductor structures.

6. The invention of claim 5 wherein said means for changing the amount of light absorbed by said multilayered semiconductor structures further includes means for selectably energizing particular layers in said multilayered semiconductor structures.

* * * * *